United States Patent
Yokoyama et al.

(10) Patent No.: US 10,549,432 B2
(45) Date of Patent: Feb. 4, 2020

(54) COMPONENT MOUNTING APPARATUS

(71) Applicant: Panasonic Intellectual Property Management Co., Ltd., Osaka (JP)

(72) Inventors: Dai Yokoyama, Yamanashi (JP); Hideaki Watanabe, Yamanashi (JP); Shigeki Imafuku, Yamanashi (JP); Yosuke Nagasawa, Yamanashi (JP); Kian Hong Lam, Singapore (SG)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 14 days.

(21) Appl. No.: 15/228,199

(22) Filed: Aug. 4, 2016

(65) Prior Publication Data

US 2017/0066141 A1 Mar. 9, 2017

(30) Foreign Application Priority Data

Sep. 7, 2015 (JP) .................... 2015-175294

(51) Int. Cl.
*B25J 15/04* (2006.01)
*H05K 13/04* (2006.01)

(52) U.S. Cl.
CPC ...... *B25J 15/0475* (2013.01); *H05K 13/0404* (2013.01); *Y10T 29/53174* (2015.01)

(58) Field of Classification Search
CPC ............. H05K 13/0404; B25J 15/0475; Y10T 29/53174
See application file for complete search history.

(56) References Cited

U.S. PATENT DOCUMENTS 4,543,032 A * 9/1985 Leverett ............... B25J 15/0475
294/86.4
4,601,637 A 7/1986 Aviles et al.
4,696,501 A * 9/1987 Webb ..................... B25J 13/082
294/103.1

FOREIGN PATENT DOCUMENTS

| CN | 202388508 U | 8/2012 |
| JP | S60-201849 A | 10/1985 |
| JP | S61-068893 U | 5/1986 |
| JP | 5-318366 | 12/1993 |
| JP | 2011-177862 A | 9/2011 |
| JP | 2013091121 A * | 5/2013 |

OTHER PUBLICATIONS

English Translation of Chinese Search Report dated Sep. 4, 2019 for the related Chinese Patent Application No. 201610804092.8.

* cited by examiner

*Primary Examiner* — Livius R. Cazan
(74) *Attorney, Agent, or Firm* — Pearne & Gordon LLP

(57) ABSTRACT

A component mounting apparatus for mounting a component on a substrate includes a pair of chuck claws that sandwich and grip the component; and adapters that are detachably mounted on the chuck claws and grip the component in place of the chuck claws. The adapters are mounted on the chuck claws in accordance with the component that is an object to be mounted and the component is gripped by using the adapters.

7 Claims, 19 Drawing Sheets

COMPONENT MOUNTING APPARATUS

BACKGROUND

1. Technical Field

The present disclosure relates to a component mounting apparatus for mounting a component on a substrate.

2. Description of the Related Art

In the mounting field, a component mounting apparatus, which mounts a component supplied by a component supplier such as a part feeder on a substrate by gripping the component by a gripping device, has been known (for example, see PTL 1). In PTL 1, as the gripping device, a configuration, in which two gripping members (indicated as "movable pieces" in PTL 1) grip the component by being moved in a direction, in which the two gripping members approach each other from both sides of the component, is disclosed.

In recent years, along with a request of high-density mounting, an adjacent distance between the components also becomes very small on the substrate. Therefore, if the size of the gripping member is large, for example, when a component is mounted at a position on the substrate adjacent to a component which is already mounted, the gripping member interferes with the component which is already mounted and thereby mounting failure may occur. In order to prevent such a situation, the size of the gripping member is designed to be as small as possible.

CITATION LIST

Patent Literature

PTL 1: Japanese Patent Unexamined Publication No. 5-318366

SUMMARY

An object of one exemplary embodiment of the disclosure is to provide a component mounting apparatus which reduces a work load of an operator and can easily change a gripping mode of a component depending on a component.

A component mounting apparatus of one exemplary embodiment of the disclosure for mounting a component on a substrate includes a pair of first gripping members that sandwich and grip the component; and second gripping members that are detachably mounted on the pair of first gripping members and grip the component in place of the pair of first gripping members. The second gripping members are mounted on the pair of first gripping members in accordance with the component that is an object to be mounted and the component is gripped by using the second gripping members.

According to one exemplary embodiment of the disclosure, a work load of an operator is reduced and it is possible to easily change a gripping mode of a component in accordance with a component.

DETAILED DESCRIPTIONS

Figure 1:
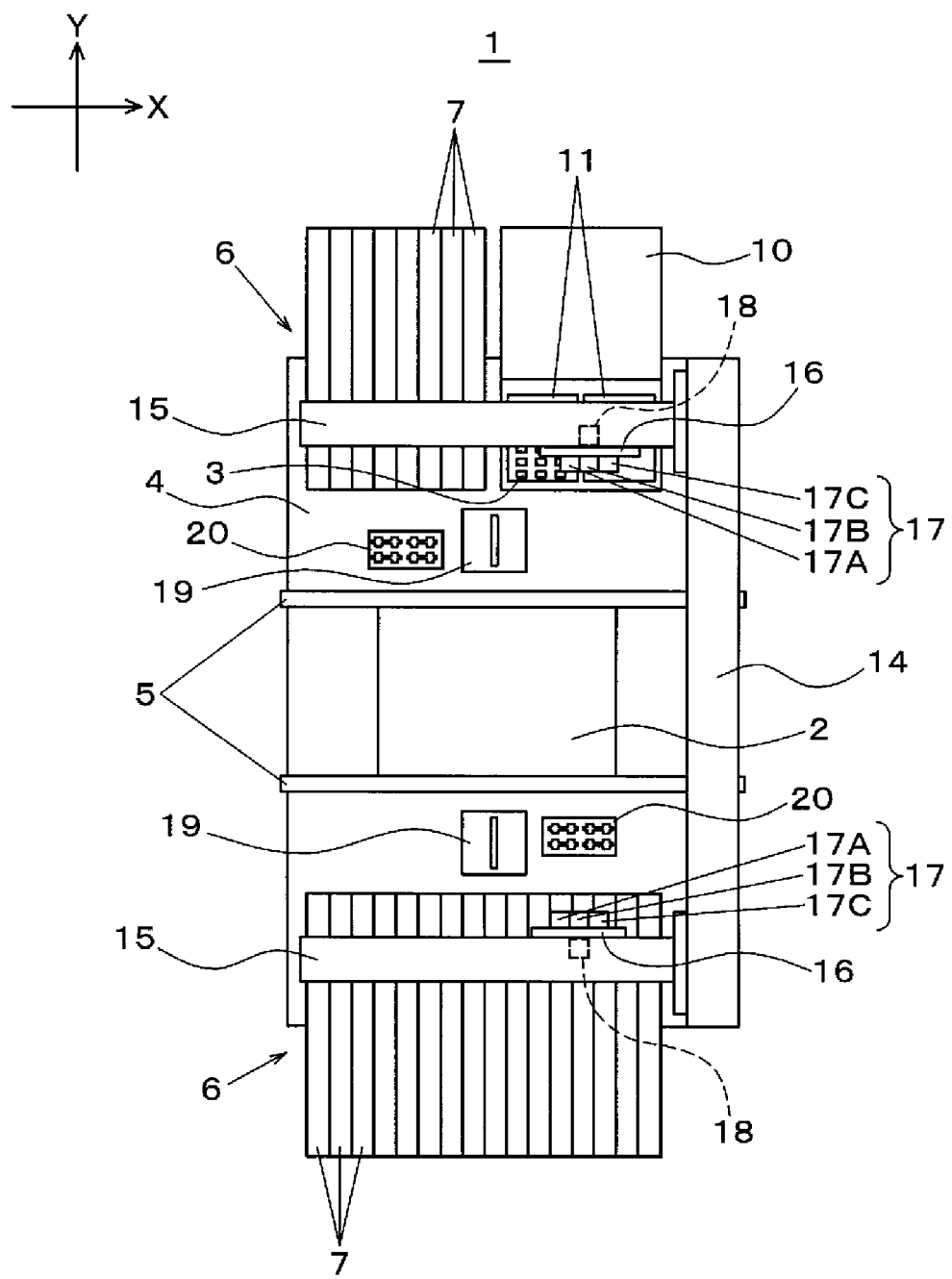
FIG. 1 is a plan view of a component mounting apparatus in an exemplary embodiment of the disclosure.

Prior to the description of an exemplary embodiment of the disclosure, problems in an apparatus of the related art are briefly described. Components that are objects to be mounted have different shapes, sizes, weights, and the like depending on the types thereof. Therefore, in a case where a large-sized component such as an electrolytic capacitor is the object to be mounted, in order to grip the component in a stable attitude, it is preferable that a gripping mode is appropriately changed depending on the component such as a gripping area is increased and the like. A specific method for changing the gripping mode includes a method in which a gripping member is replaced with another gripping member having a different size and shape of a gripping surface. However, in the related art described above, in order to change the gripping mode of the component, it is necessary to remove and mount the other gripping member from and on the gripping device for each gripping member. Therefore, there is a problem that not only a tremendous amount of work load is caused on an operator but also a long period of time is required for replacement work and thereby productivity is considerably lowered.

First, a component mounting apparatus in an exemplary embodiment of the disclosure will be described with reference to FIGS. 1 and 2. Component mounting apparatus 1 has a function of mounting component 3 on substrate 2. Hereinafter, a horizontal transporting direction of substrate 2 is defined as an X direction, a direction orthogonal to the X direction in a horizontal plane is defined as a Y direction, and a direction perpendicular to an XY plane is defined as a Z direction. Substrate transport mechanism 5 including a pair of transport conveyors extending in the X direction is provided on an upper surface of base 4 included in component mounting apparatus 1. Substrate transport mechanism 5 transports substrate 2 and aligns substrate 2 in a predetermined working position.

Component suppliers 6 are respectively provided in positions on both sides of substrate transport mechanism 5 in the Y direction. A plurality of tape feeders 7 are disposed in component supplier 6 on a front side (lower side of a paper surface) in a state of being arranged in parallel in the X direction. In FIG. 2, tape feeder 7 is set above carriage 8, carrier tape 9 holding a plurality of components 3 is intermittently fed, and thereby component 3 is supplied on a predetermined component supply position. As an object to be supplied by tape feeder 7, a very small chip component such as 0603 is exemplified.

Figure 2:
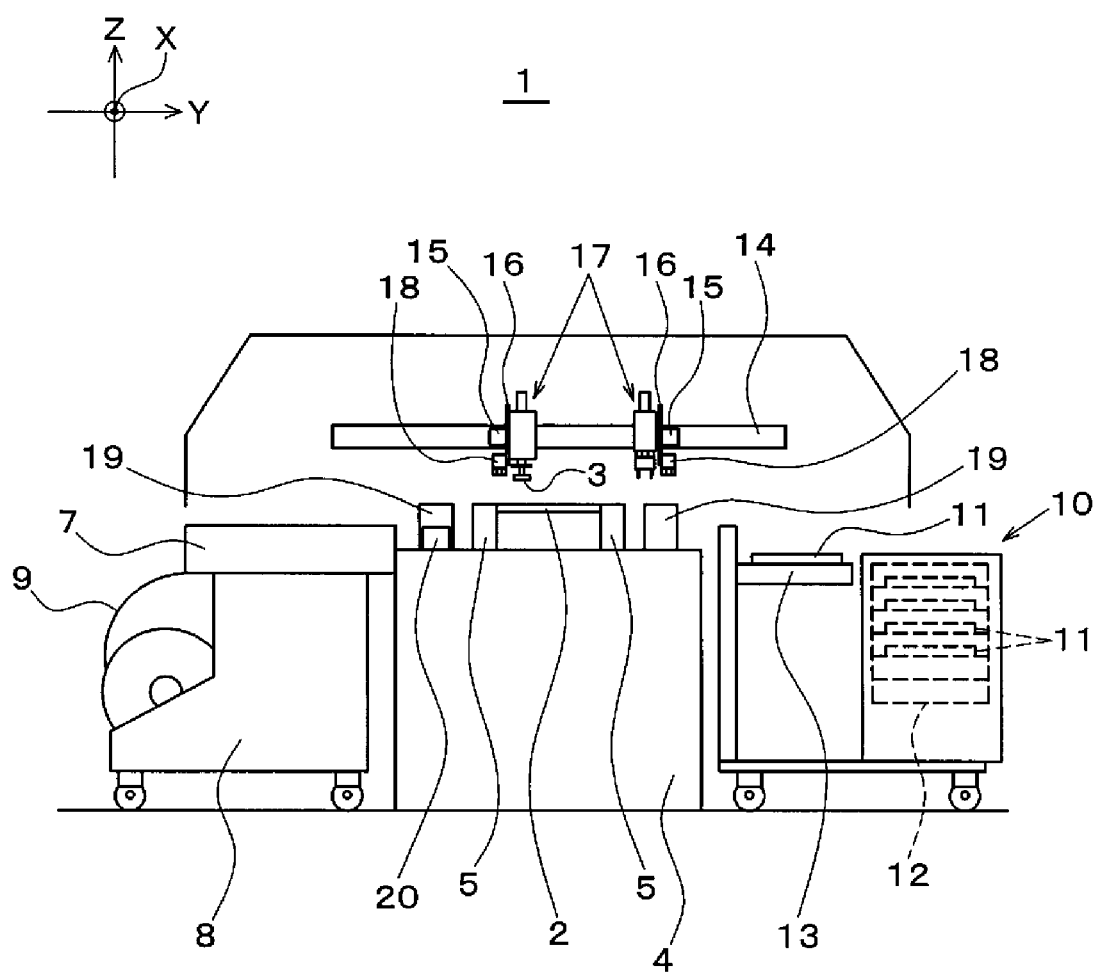
FIG. 2 is a front view of the component mounting apparatus in an exemplary embodiment of the disclosure.

In FIG. 1, the plurality of tape feeders 7 and tray feeder 10 are disposed in component supplier 6 on a rear side (upper side of the paper surface) in a state of being arranged in parallel in the X direction. In FIG. 2, tray feeder 10 includes tray storage 12 storing a plurality of trays 11 held in a pallet (not illustrated) and tray holder 13 that is capable of holding trays 11 is movably provided in a horizontal direction and a vertical direction. The plurality of components 3 are stored in tray 11. Tray feeder 10 has a function of pulling out tray 11 from tray storage 12 by tray holder 13 and supplying tray 11 on a taking-out position of component 3 by mounting head 17 described below. As an object to be supplied by tray feeder 10, a large-sized component such as an electrolytic capacitor is exemplified.

In FIG. 1, Y-axis beam 14 is provided in an end portion of base 4 in the X direction and a plurality of X-axis beams 15 are provided in Y-axis beam 14 movably in the Y direction. Planar plate member 16 is mounted on each X-axis beam 15 slidably in the X direction and mounting head 17 is mounted on plate member 16. Mounting head 17 can be moved in the XY direction by driving Y-axis beam 14 and X-axis beam 15. Mounting head 17 has a function of taking out component 3 from tape feeder 7 or tray feeder 10 and mounting component 3 on substrate 2.

First recognition camera 18 of which an imaging field faces downward is provided in plate member 16. First recognition camera 18 images a substrate mark (not illustrated) and the like formed in substrate 2 which is aligned in a working position. Second recognition cameras 19 of which an imaging field faces upward and adapter stockers 20 are provided between substrate transport mechanism 5 and component suppliers 6 in base 4. Second recognition camera 19 images component 3 held in mounting head 17 moving above second recognition camera 19 from below. Adapter stocker 20 stores adapters 50 (FIGS. 8A and 8B) which are described below.

Next, a configuration of mounting head 17 will be described with reference to FIG. 3. Mounting head 17 is configured of a plurality (three in the example) of unit heads 17A, 17B, and 17C. Each of unit heads 17A and 17B is configured to include head body 21 and suction nozzle 22 mounted on a lower end portion of head body 21. A rotation mechanism (not illustrated) for rotating suction nozzle 22 in the horizontal direction and the like are built into head body 21. Suction nozzle 22 is moved, that is, lifted in the Z direction by nozzle lifting mechanism 23 disposed above head body 21. Suction nozzle 22 holds component 3 by sucking component 3 supplied from tape feeder 7, and transfers and mounts component 3 on substrate 2. Moreover, in this description, mounting head 17 is configured of the plurality of unit heads 17A 17B, and 17C, but may be configured of only one unit head 17C.

Figure 3:
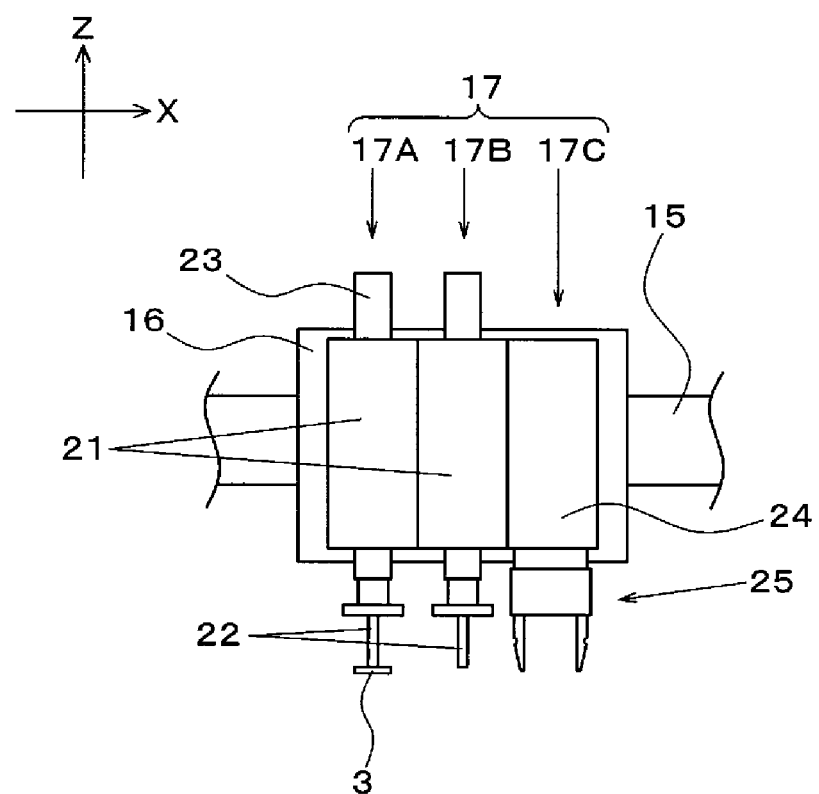
FIG. 3 is a front view of a mounting head included in the component mounting apparatus in an exemplary embodiment of the disclosure.
Figure 4:
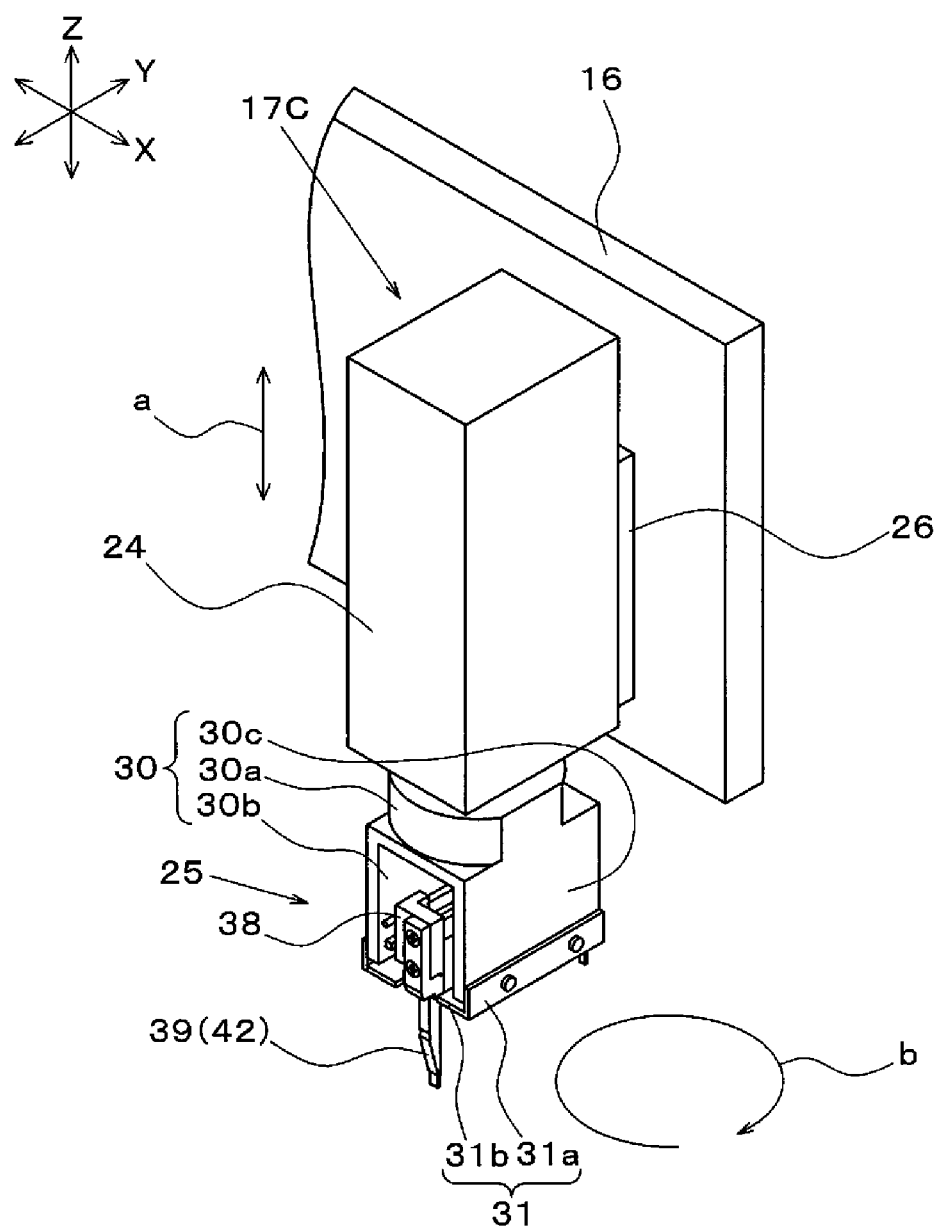
FIG. 4 is a perspective view of the mounting head included in the component mounting apparatus in an exemplary embodiment of the disclosure.

In FIGS. 3 and 4, unit head 17C is configured to include head body 24 and chuck unit 25, of which an axis is the vertical direction (Z direction) and which is mounted below head body 24 rotatably in the horizontal direction. For the sake of convenience, in FIG. 4, unit heads 17A and 17B are not illustrated. Rail member 26 extending in the Z direction is provided in plate member 16 and a slider (not illustrated) is mounted on rail member 26 slidably in the Z direction. Z-axis lifting motor 27 (FIG. 16) causing the slider to be lifted is built into head body 24. Unit head 17C is lifted (arrow a) by driving of Z-axis lifting motor 27 along rail member 26 via the slider. In addition, chuck unit 25 is rotated (arrow b) in the horizontal direction by driving of horizontal rotation mechanism 28 (FIG. 16) built into head body 24. Chuck unit 25 illustrated in FIG. 4 represents a state of being rotated by 90 degrees from an attitude of chuck unit 25 illustrated in FIG. 3.

Chuck unit 25 has base 30 as a main body. Base 30 is configured to include a substantially cylindrical cylinder portion 30a which is opened in the vertical direction and two planar walls 30b and 30c which extend in the vertical direction and are disposed below cylindrical cylinder portion 30a to face each other. In FIG. 5B, bending members 31, which are substantially bent in an L-shape, are provided below walls 30b and 30c in a state of facing each other. Bending member 31 is configured of vertical portion 31a extending in the vertical direction and extending portion 31b extending from below vertical portion 31a in a direction in which walls 30b and 30c face each other. A predetermined gap S is formed between extending portions 31b and 31b.

Figure 5A:
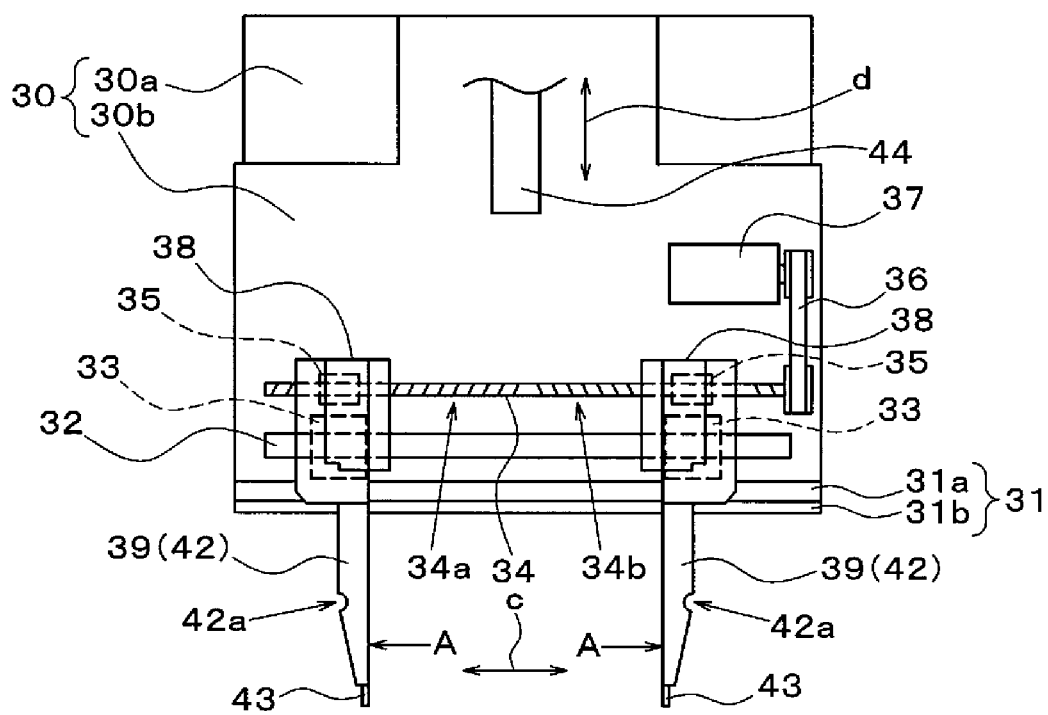
FIG. 5A is an explanatory view of a structure of a chuck unit configuring the mounting head included in the component mounting apparatus in an exemplary embodiment of the disclosure.
Figure 5B:
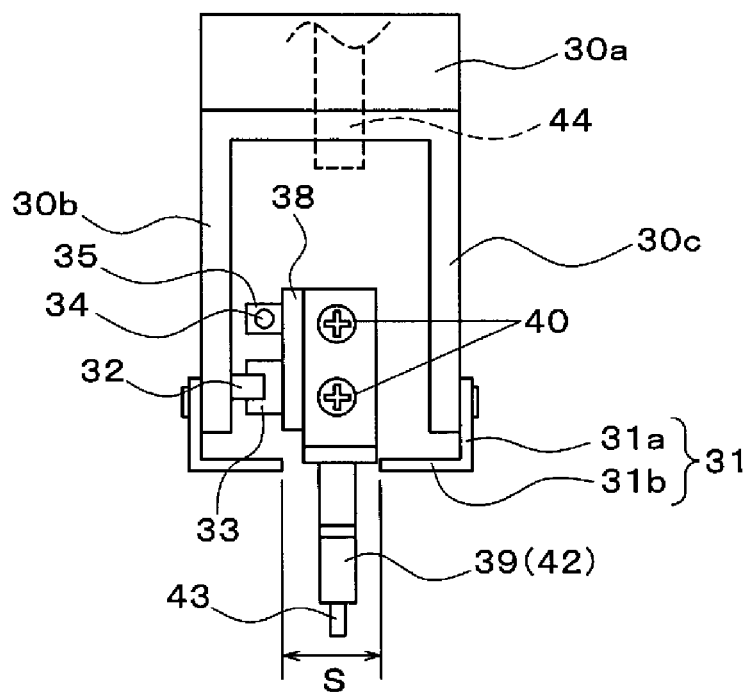
FIG. 5B is an explanatory view of the structure of the chuck unit configuring the mounting head included in the component mounting apparatus in an exemplary embodiment of the disclosure.

In FIG. 5A, rail member 32 extending in the horizontal direction is fixed to a surface of one wall 30b facing the other wall 30c. A plurality (two in the example) of sliders 33 are mounted on rail member 32 slidably in a longitudinal direction. Ball screw 34 extending in parallel with rail member 32 is provided in wall 30b via a bracket (not illustrated) above rail member 32. Ball screw 34, is rotatable in the longitudinal direction as the axis. First screw groove 34a and second screw groove 34b having screws opposite to each other are formed in ball screw 34 side by side in the longitudinal direction. Block bodies 35 are respectively screwed in screw grooves 34a and 34b. Ball screw 34 is connected to drive motor 37 via transmission belt 36. Ball screw 34 is rotated by the driving of drive motor 37. For the sake of convenience, in FIG. 5B, drive motor 37 and transmission belt 36 are not illustrated.

Chuck holder 38 having a substantially L shape is fixed to one slider 33 and block body 35, and chuck claw 39 is fixed to each chuck holder 38 via screws 40. A pair of chuck claws 39 are provided in a state where gripping surfaces A for gripping component 3 face each other. The pair of chuck claws 39 are moved (arrow c) by the driving of drive motor 37 along ball screw 34 in synchronization with each other in a direction in which chuck claws 39 approach and separate from each other.

Figure 6A:
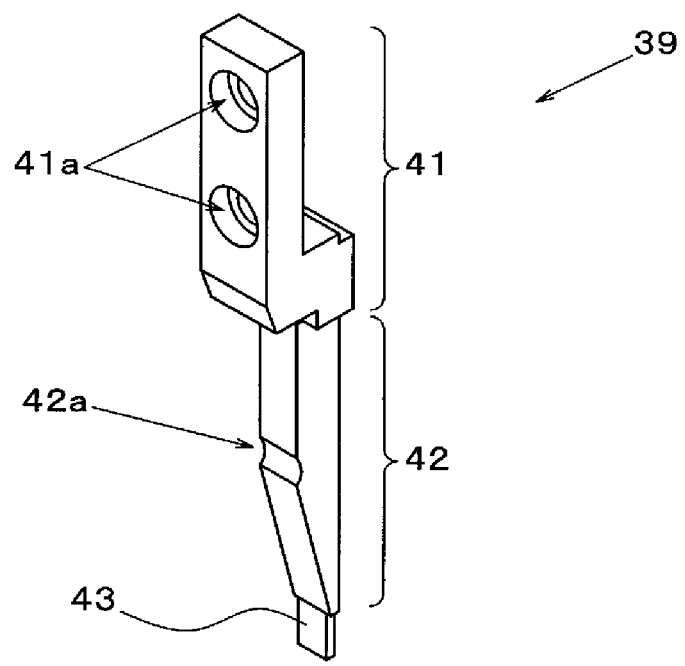
FIG. 6A is a perspective view of a chuck claw included in the chuck unit configuring the mounting head included in the component mounting apparatus in an exemplary embodiment of the disclosure.
Figure 6B:
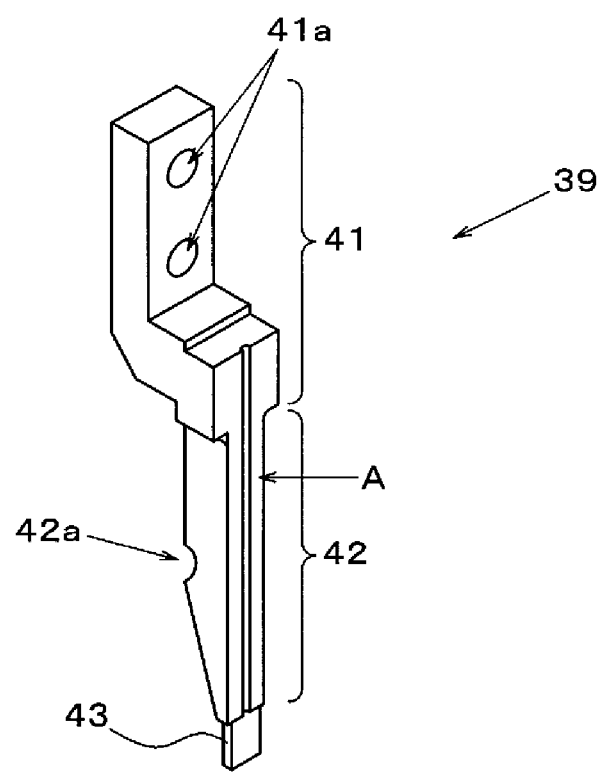
FIG. 6B is a perspective view of the chuck claw included in the chuck unit configuring the mounting head included in the component mounting apparatus in an exemplary embodiment of the disclosure.

Chuck claws 39 are provided to chuck (grip) component 3 and are molded of synthetic resin. In FIGS. 6A and 6B, chuck claw 39 is configured to include base 41 having a substantially L shape and claw 42 extending from below base 41 in the vertical direction. A plurality of holes 41a are formed in base 41 and screws 40 (FIG. 5B) are screwed into screw holes (not illustrated) of chuck holder 38 via holes 41a.

In FIGS. 5A and 5B, claw 42 is exposed from below base 30 and is moved along gap S formed between two bending members 31. Locking groove 42a is formed on a surface opposite to gripping surface A of claw 42. Locking groove 42a is used when mounting adapter 50 described below. Planar auxiliary claw 43 is provided below claw 42. Auxiliary claw 43 has a function of assisting gripping of component 3 by coming into contact with a position in which claws 42 do not grip component 3. Moreover, auxiliary claw 43 may be omitted.

Pusher 44 is disposed vertically movably on an inside of base 30. Pusher 44 is lifted (arrow d indicated in FIG. 5A) by the driving of pusher lifting mechanism 45 (FIG. 16) built into head body 24. Pusher 44 is lowered with respect to component 3 gripped by the pair of chuck claws 39 thereby depressing component 3.

Figure 7A:
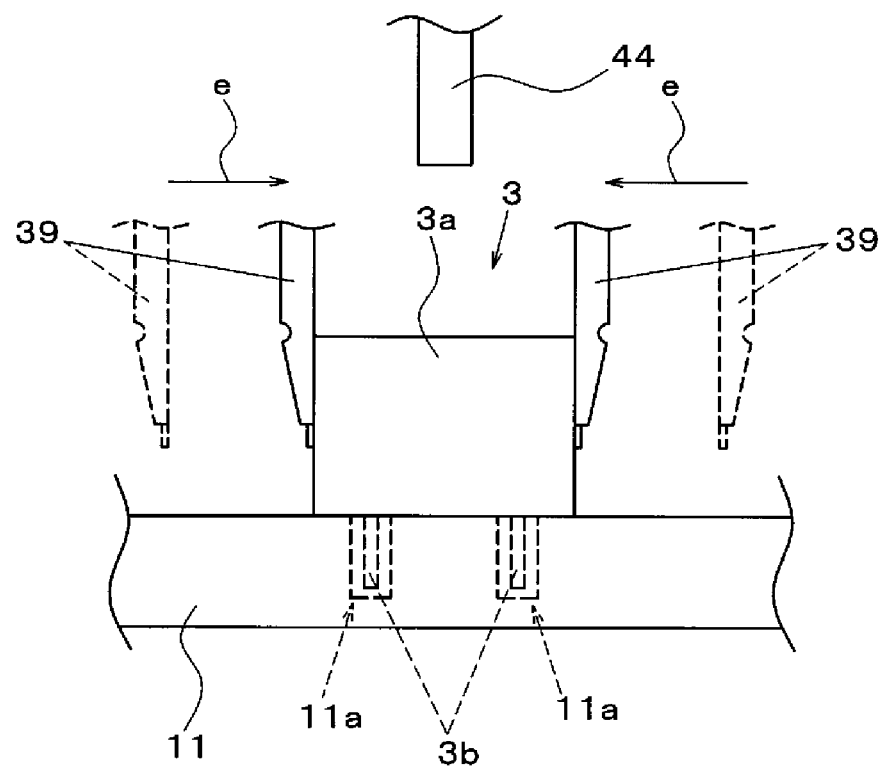
FIG. 7A is an explanatory view of a mounting operation of a component by using the chuck unit in an exemplary embodiment of the disclosure.
Figure 7B:
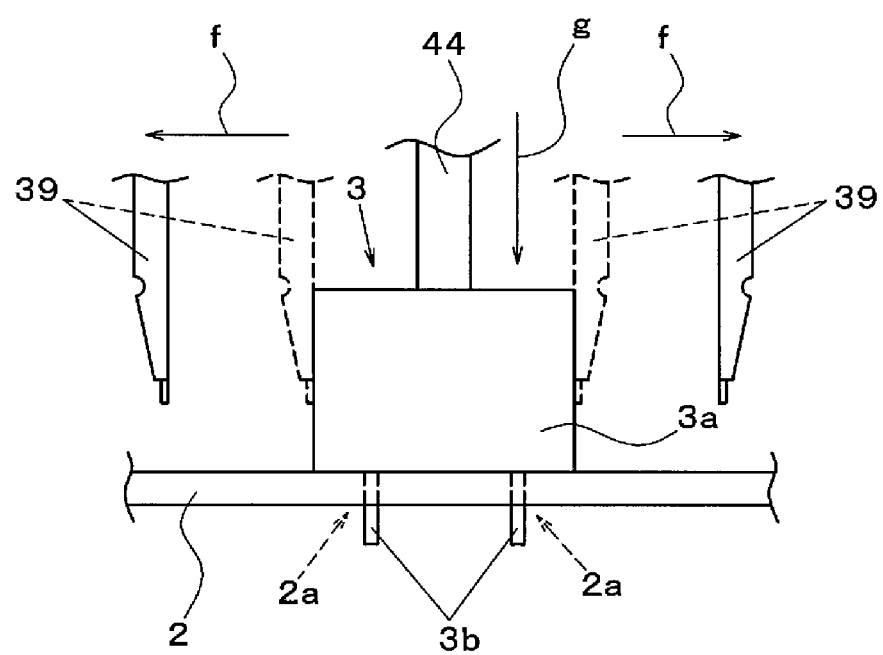
FIG. 7B is an explanatory view of the mounting operation of the component by using the chuck unit in an exemplary embodiment of the disclosure.

A gripping operation of component 3 and a mounting operation of component 3 on substrate 2 by using chuck unit 25 will be described with reference to FIGS. 7A and 7B. Controller 70 (FIG. 16) of component mounting apparatus 1 controls various mechanisms including drive motor 37 and thereby the operations described below are performed. As illustrated in FIG. 7A, component 3 that is to be worked by chuck unit 25 is a large-sized component including a pair of leads 3b on a lower surface of body 3a and is supplied by tray feeder 10. Recesses 11a are provided in positions corresponding to the pair of leads 3b in tray 11, leads 3b are inserted into recesses 11a, and thereby component 3 is in a state of being stored in tray 11. Component 3 is supplied by tray feeder 10 in such a state.

First, as illustrated in FIG. 7A, the pair of chuck claws 39 are lowered with respect to component 3 stored in tray 11 and then enclose body 3a from both sides in a state of being moved in advance in a direction in which chuck claws 39 are separated from each other (see chuck claws 39 indicated by broken lines). Next, the pair of chuck claws 39 are moved (arrows e) in a direction in which chuck claws 39 approach each other and body 3a is interposed therebetween. Therefore, the pair of chuck claws 39 are in a state of gripping component 3. As described above, the pair of chuck claws 39 are a pair of first gripping members for sandwiching and gripping component 3. In addition, rail member 32, slider 33, ball screw 34, block body 35, chuck holder 38, transmission belt 36, and drive motor 37 are gripping member movers which move the pair of first gripping members respectively in a direction in which the pair of first gripping members approach or separate from each other. Moreover, the pair of chuck claws 39 may be configured in which both are not movable. That is, at least one of chuck claws 39 is moved in the direction in which one chuck claw 39 approaches or separates with respect to the other chuck claw 39, and thereby a gap of the pair of chuck claws 39 can be changed.

Thereafter, the pair of chuck claws 39 in a state of gripping component 3 is moved above substrate 2 that is aligned in a working position in advance. Next, as illustrated in FIG. 7B, the pair of chuck claws 39 are lowered with respect to substrate 2 and thereby causes a lower surface of body 3a to come into contact with substrate 2 while inserting leads 3b into openings 2a formed in substrate 2. Next, the pair of chuck claws 39 are moved (arrows f) in a direction in which chuck claws 39 are separated from each other and thereby gripping of component 3 is released. Next, pusher 44 is lowered (arrow g) and thereby component 3 is pressed against substrate 2. Thereafter, leads 3b are clinched by a clinch mechanism (not illustrated). Therefore, component 3 is mounted on substrate 2.

Next, adapter 50 detachably mounted on chuck claw 39 will be described with reference to FIGS. 8A to 11B. Adapter 50 grips component 3 in place of chuck claws 39 and is configured to include flange 51 and gripper 52 provided below flange 51. Flange 51 is a member having a substantially H shape in which cutouts 51a are respectively formed on both sides in the longitudinal direction. Cutouts 51a are used when storing adapter 50 in adapter stocker 20 described below. Opening 51b, which is opened in the vertical direction for inserting chuck claw 39 in the longitudinal direction, is formed at a substantially center of flange 51 in a plan view. Opening 51b is set to a size corresponding to claw 42 of chuck claw 39 viewed from the longitudinal direction.

Figure 9A:
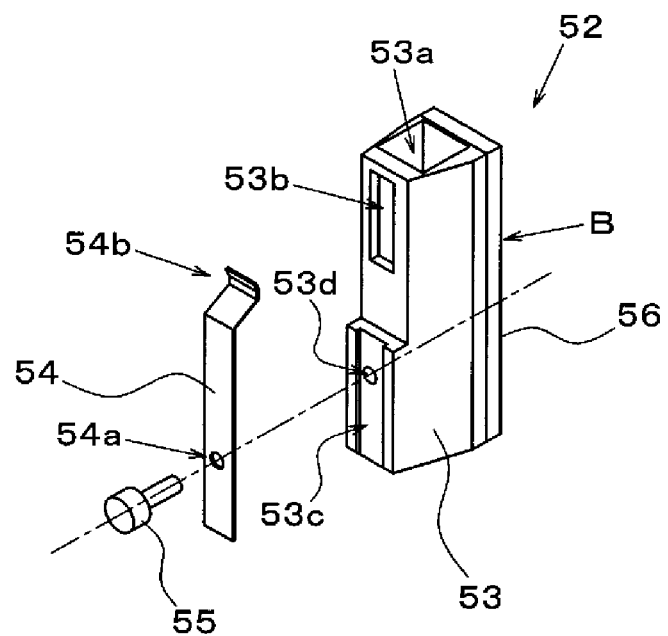
FIG. 9A is a perspective view of an adapter detachably mounted on the chuck unit in an exemplary embodiment of the disclosure.
Figure 9B:
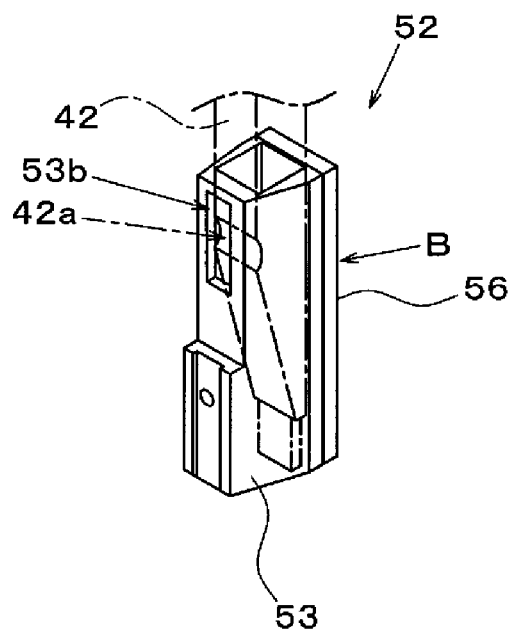
FIG. 9B is a perspective view of the adapter detachably mounted on the chuck unit in an exemplary embodiment of the disclosure.
Figure 10A:
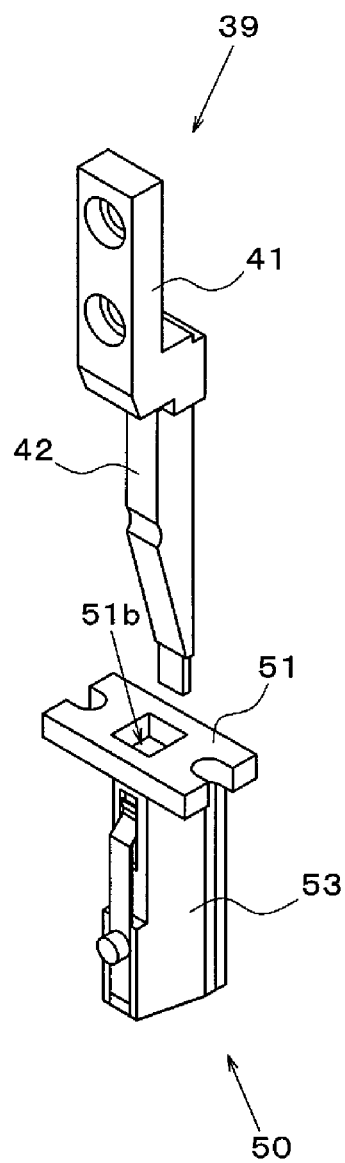
FIG. 10A is a view illustrating a state before the adapter is mounted on the chuck claw in an exemplary embodiment of the disclosure.
Figure 10B:
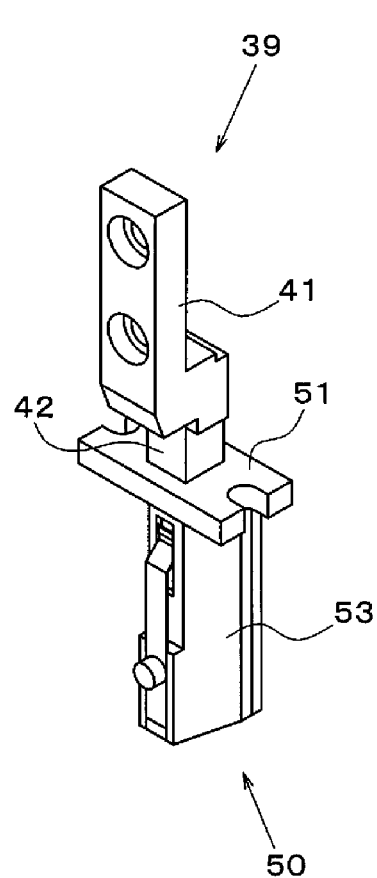
FIG. 10B is a view illustrating a state where the adapter is mounted on the chuck claw in an exemplary embodiment of the disclosure.
Figure 10C:
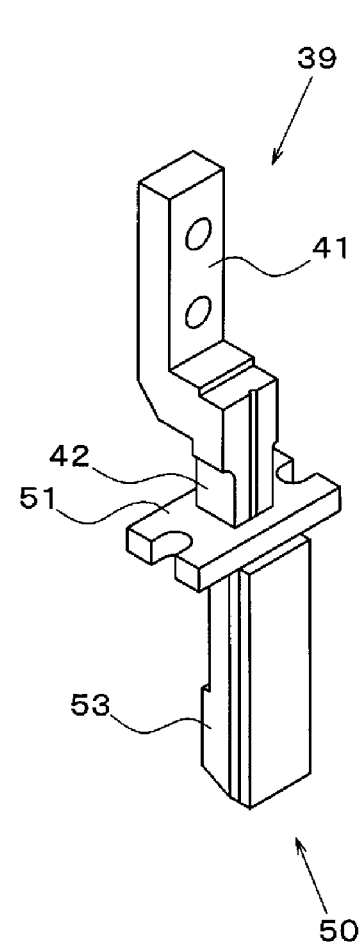
FIG. 10C is a view illustrating a state where the adapter is mounted on the chuck claw in an exemplary embodiment of the disclosure.

In FIG. 9A, gripper 52 has block member 53 of a polyhedral structure as a main body and one surface is formed in a multi-stage. First opening 53a of which an upper surface is opened is formed in block member 53 in a state of communicating with opening 51b of flange 51. First opening 53a is also set to a size corresponding to claw 42 of chuck claw 39 viewed from the longitudinal direction. Therefore, opening 51b and first opening 53a form one opening in a continuous state in the vertical direction. That is, adapter 50 has an opening (opening 51b and first opening 53a) of which an upper surface is opened. Second opening 53b is formed in an upper portion of one side surface of block member 53 in a state of communicating with first opening 53a. As illustrated in FIG. 9B, in a state where claw 42 is inserted into a deep portion of block member 53, locking groove 42a is in a state of being exposed through second opening 53b.

Figure 8A:
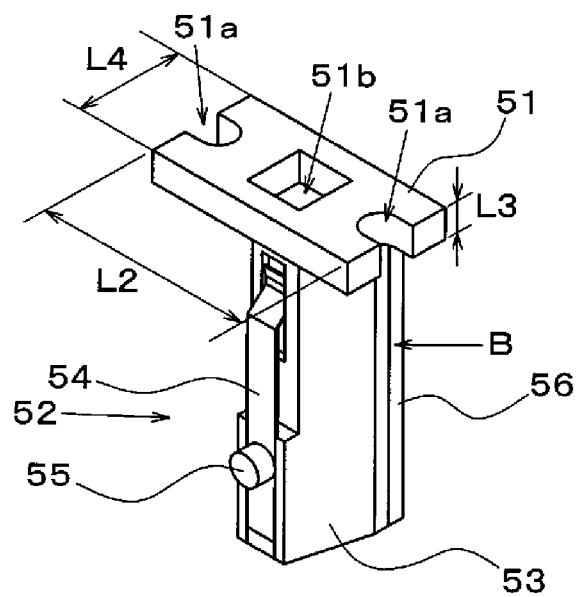
FIG. 8A is a perspective view of an adapter detachably mounted on the chuck claw included in the chuck unit in an exemplary embodiment of the disclosure.

Groove 53c for mounting leaf spring member 54 is formed to be vertically extended in a position below second opening 53b on one side surface of block member 53. Screw hole 53d is formed in a position corresponding to groove 53c, screw 55 is screwed into screw hole 53d via hole 54a formed in leaf spring member 54, and thereby leaf spring member 54 is mounted on block member 53 (FIG. 8A).

Leaf spring member 54 is an elastic body having a rectangular planar shape extending to a position corresponding to second opening 53b. Bending portion 54b, which is belt on an inner side of block member 53 is formed in a position of a free end or an upper end portion of leaf spring member 54 corresponding to second opening 53b. In a state where a force does not act on leaf spring member 54 from the outside, bending portion 54b is in a state of partially passing through second opening 53b and entering until first opening 53a.

A surface, which is the other side surface opposite to one side surface on which second opening 53b of block member 53 is formed and corresponds to gripping surface A of chuck claw 39, is gripping surface B for gripping component 3. Here, a shape and size of gripping surface B of adapter 50 for gripping component 3 are different from those of gripping surface A of chuck claw 39 for gripping component 3. That is, the shape and size of gripping surface B of adapter 50 are arbitrarily designed in accordance with the shape, the size, the weight, and the like of component 3 that is the object to be worked. Then, adapter 50 having gripping surface B in accordance with the shape and the size of component 3 is mounted on chuck claw 39 and thereby it is possible to stably grip components 3 of various types. In the exemplary embodiment, sheet-like member 56 in which a sheet-like elastic member such as urethane rubber is formed is adhered to gripping surface B of block member 53. Sheet-like member 56 is molded in a shape corresponding to gripping surface B. When gripping component 3, sheet-like member 56 comes into contact with component 3 so as not to give scratches on component 3. Moreover, sheet-like member 56 may be omitted.

Figure 11A:
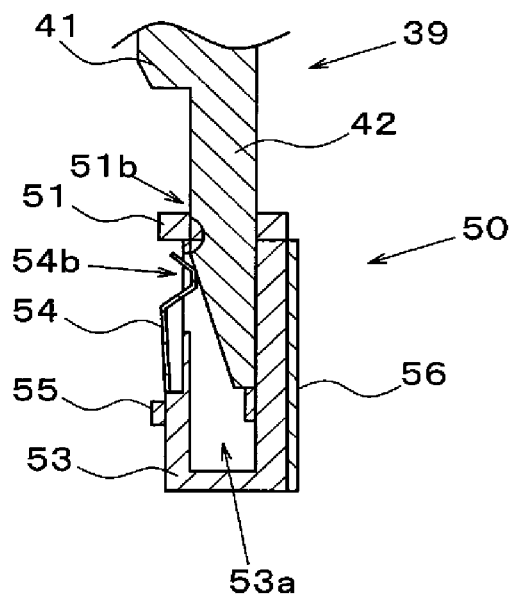
FIG. 11A is a sectional view of the chuck claw and the adapter in an exemplary embodiment of the disclosure.
Figure 11B:
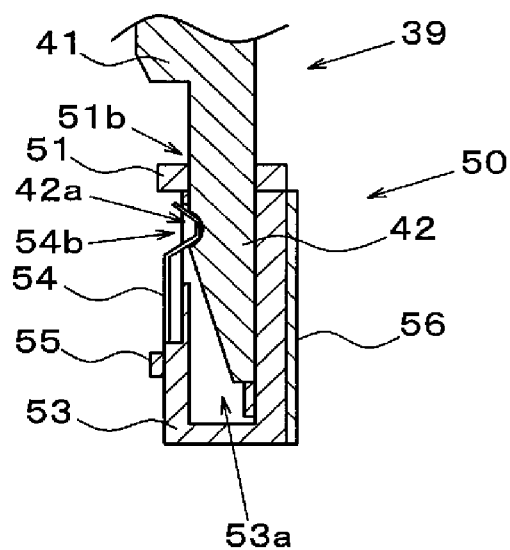
FIG. 11B is a sectional view of the chuck claw and the adapter in an exemplary embodiment of the disclosure.

Next, a mode when mounting adapter 50 on chuck claw 39 will be described with reference to FIGS. 11A and 11B. FIGS. 11A and 11B illustrate sectional views of adapter 50 and chuck claw 39. First, a leading end portion of chuck claw 39 is inserted into opening 51b of flange 51. Then, as illustrated in FIG. 11A, bending portion 54b is pushed by the surface (non-forming portion of locking groove 42a) of claw 42 in a direction opposite to a bending direction while claw 42 of chuck claw 39 passes through first opening 53a of block member 53. Then, as illustrated in FIG. 11B, bending portion 54b is fitted into locking groove 42a to restore in the bending direction at a timing when locking groove 42a of claw 42 reaches a predetermined position corresponding to second opening 53b. Therefore, bending portion 54b is locked to locking groove 42a and adapter 50 is mounted on chuck claw 39 without falling. As described above, bending portion 54b included in adapter 50 functions as locking portion that is capable of locking to locking groove 42a included in chuck claw 39. Moreover, in a case where adapter 50 is removed from chuck claw 39, adapter 50 is shifted downward with respect to chuck claw 39 against an elastic force of leaf spring member 54. Therefore, engagement between bending portion 54b and locking groove 42a is forcibly released and adapter 50 is separated from chuck claw 39.

Figure 12:
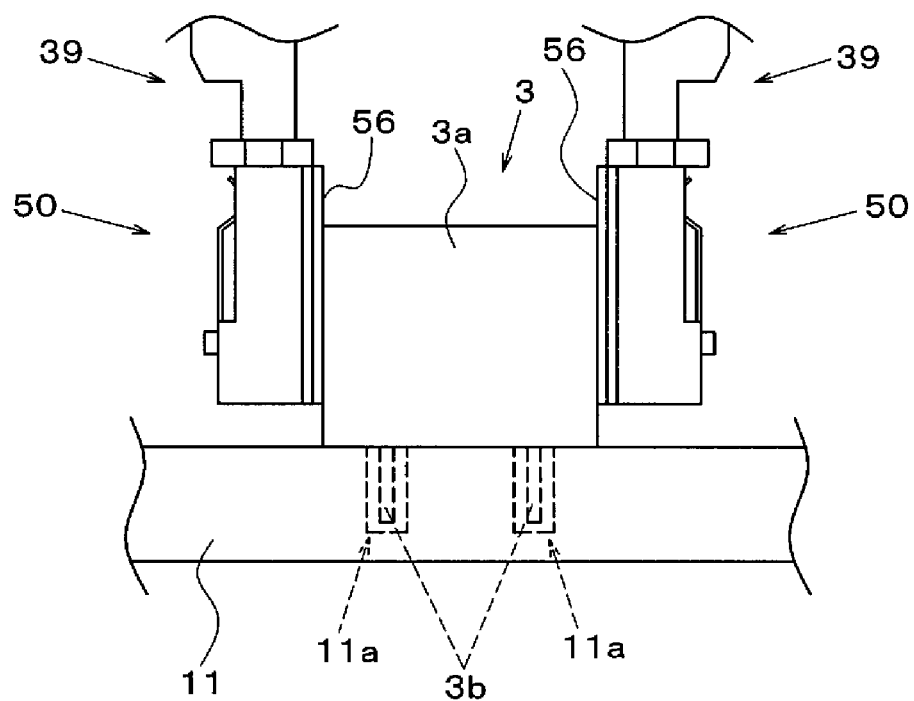
FIG. 12 is an explanatory view illustrating an operation for gripping the component by using the adapter in an exemplary embodiment of the disclosure.

Gripping of component 3 by adapter 50 is similar to gripping of component 3 by chuck claw 39. That is, as illustrated in FIG. 12, adapters 50 mounted on the pair of chuck claws 39 are moved in a direction approaching each other from a state of enclosing body 3a of component 3 on tray 11 from both sides and thereby body 3a of component 3 is sandwiched and gripped. As described above, adapters 50 are second gripping members which are detachably mounted on chuck claws 39 (first gripping members) and grip gripping component 3 in place of chuck claws 39. In addition, gripping surface B of the second gripping member is coated by an elastic member (sheet-like member 56).

Adapters 50 are used, for example, in a case where a large-sized component 3 which cannot be stably gripped by chuck claws 39 is the object to be worked. That is, chuck claws 39 are incorporated in chuck unit 25, replacement work of chuck claws 39 takes a predetermined time and great deal of effort is generated for the operator. Therefore, in the exemplary embodiment, adapters 50 having gripping surfaces B corresponding to the size and the shape of component 3 are mounted on chuck claws 39 and component 3 is gripped by using adapters 50. That is, adapters 50 (second gripping members) are mounted on chuck claws 39 (first gripping members) in accordance with component 3 that is the object to be mounted and component 3 is gripped by using adapters 50. Therefore, replacing work is not required by the operator and it is possible to briefly change the gripping mode of the component in accordance with component 3. In addition, a configuration, in which bending portion 54b (locking portion) is fitted into locking groove 42a, or fitting of bending portion 54b into locking groove 42a is released, and thereby adapter 50 is mounted or demounted on and from chuck claw 39, is employed. Therefore, mounting and demounting of adapter 50 is easily performed.

The operator prepares a plurality of adapters 50 having gripping surfaces B in accordance with the shapes and the sizes of various components 3 in a production site. Then, adapters 50 suitable for component 3 are appropriately mounted on chuck claws 39 and the production of mounting substrate is performed. As described above, adapters 50 (second gripping members) are mounted on chuck claws 39 (first gripping members) in accordance with component 3 that is the object to be mounted and component 3 is gripped and mounted on substrate 2 by using adapter 50. Therefore, it is possible to realize flexible production in accordance with the types of various components 3.

Figure 13A:
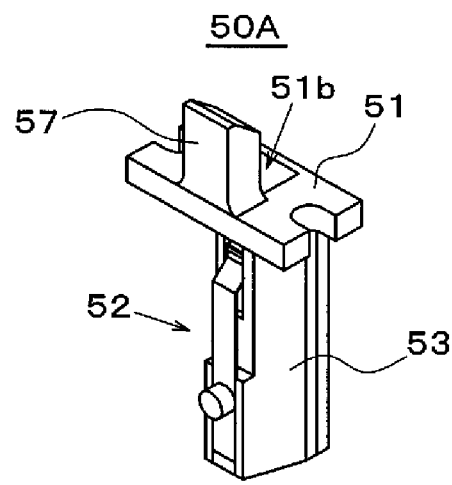
FIG. 13A is an explanatory view of a structure of a modification example of an adapter detachably mounted on a chuck claw included in a chuck unit in an exemplary embodiment of the disclosure.
Figure 13B:
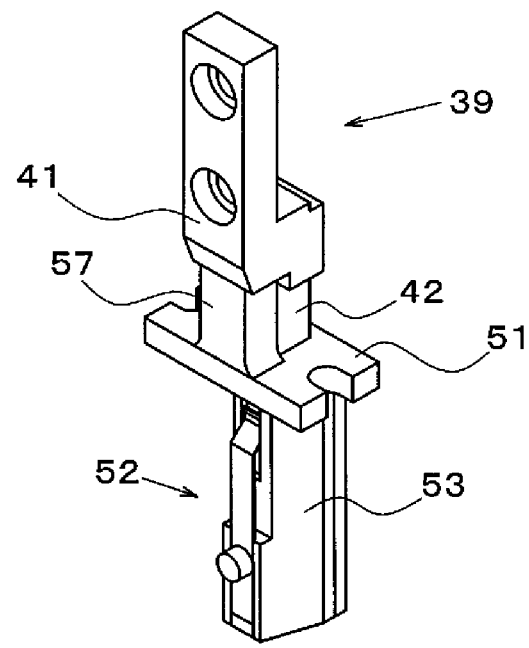
FIG. 13B is an explanatory view of the structure of the modification example of the adapter detachably mounted on the chuck claw included in the chuck unit in an exemplary embodiment of the disclosure.
Figure 13C:
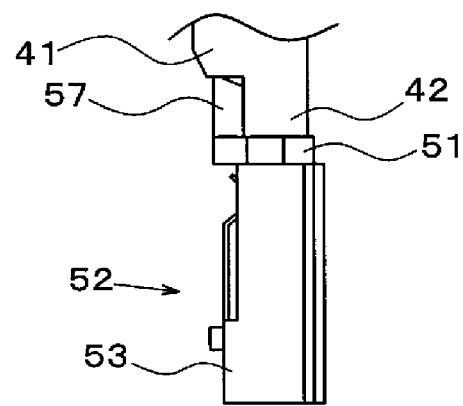
FIG. 13C is an explanatory view of the structure of the modification example of the adapter detachably mounted on the chuck claw included in the chuck unit in an exemplary embodiment of the disclosure.

A modification example of adapter 50 will be described with reference to FIGS. 13A, 13B, and 13C. Adapter 50A illustrated in FIG. 13A is configured to include protrusion 57 protruding upward from an upper surface of flange 51 in addition to the configuration of adapter 50 described above. As illustrated in FIGS. 13B and 13C, when adapter 50A is mounted on chuck claw 39, protrusion 57 abuts against base 41 of chuck claw 39. Therefore, adapter 50A is not excessively inserted into chuck claw 39.

Figure 14A:
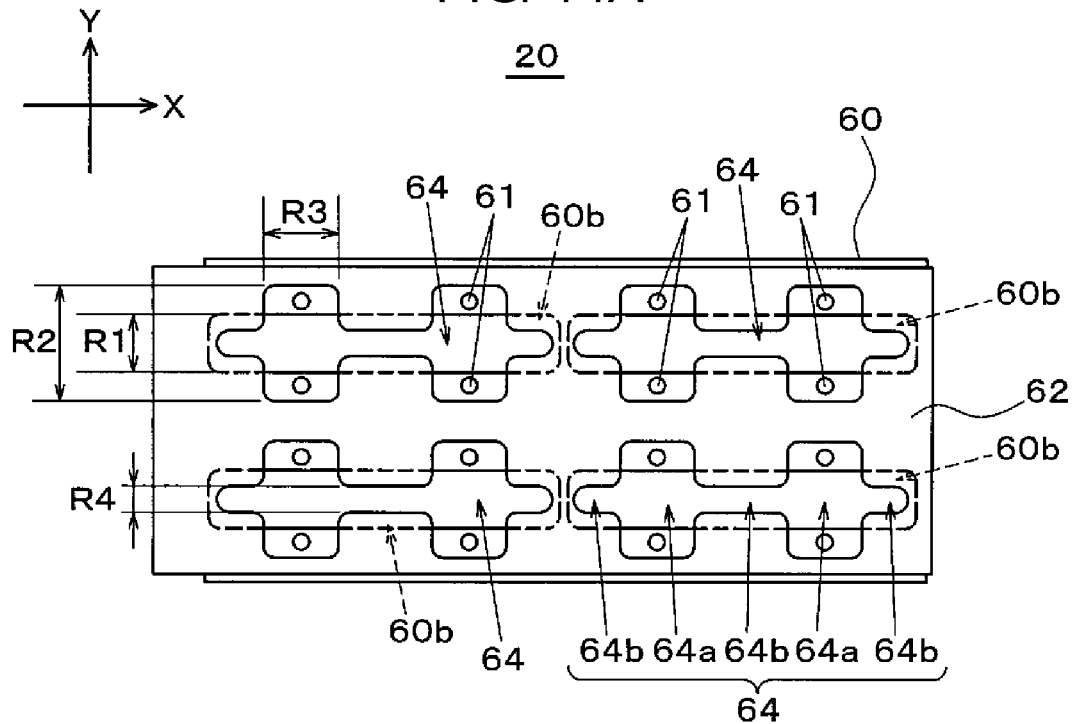
FIG. 14A is a plan view of an adapter stocker included in the component mounting apparatus in an exemplary embodiment of the disclosure.
Figure 14B:
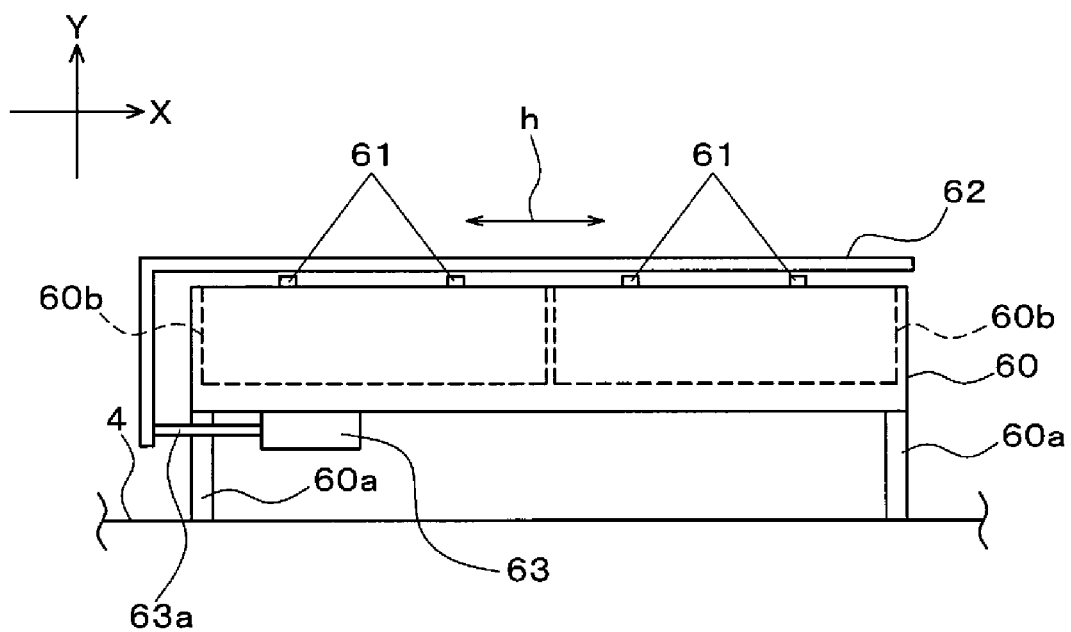
FIG. 14B is a side view of the adapter stocker included in the component mounting apparatus in an exemplary embodiment of the disclosure.

Next, adapter stocker 20 will be described with reference to FIGS. 14A and 14B. Adapter stocker 20 functions as a gripping member storage for storing adapters 50 that is the second gripping members. In the example, adapter stocker 20 in which adapters 50 having no protrusions 57 are objects to be stored will be described. Adapter stocker 20 includes storage block 60 supplied on base 4 by support bracket 60a. A plurality (four in the example) of storage openings 60b are provided in storage block 60 in a grid arrangement to store and hold adapters 50 in a standing attitude. Storage opening 60b extends in the X direction and a pair of adapters 50 are stored and held. That is, adapter stocker 20 of the example is capable of storing a total four sets of the pair of adapters 50.

Figure 8B:
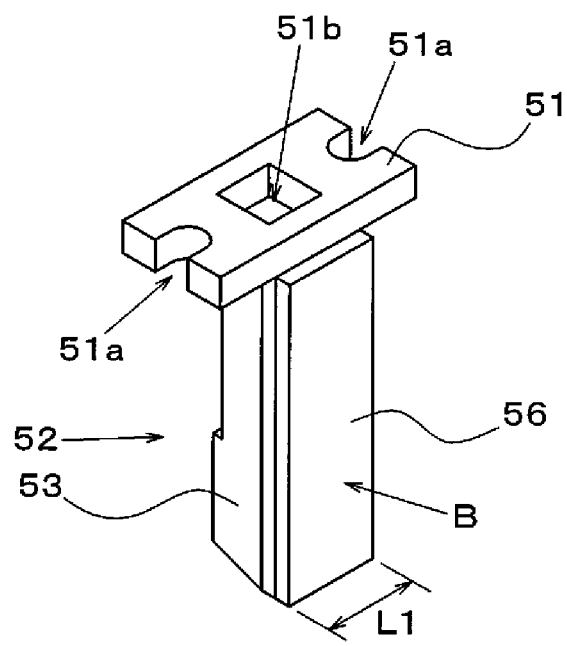
FIG. 8B is a perspective view of the adapter detachably mounted on the chuck claw included in the chuck unit in an exemplary embodiment of the disclosure.
Figure 15A:
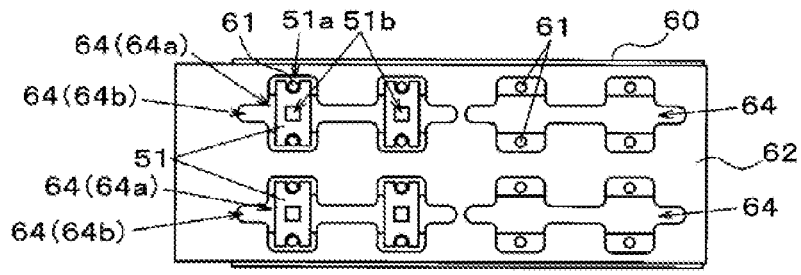
FIG. 15A is a plan view of the adapter stocker included in the component mounting apparatus in an exemplary embodiment of the disclosure.
Figure 15B:
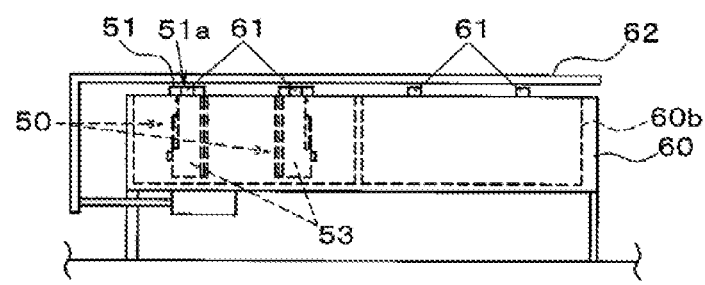
FIG. 15B is a side view of the adapter stocker included in the component mounting apparatus in an exemplary embodiment of the disclosure.

Length dimension R1 of storage opening 60b in the Y direction is set to be greater than diameter dimension L1 of block member 53 of adapter 50 in the longitudinal direction illustrated in FIG. 8B and set to be less than diameter dimension L2 of flange 51 of adapter 50 in the longitudinal direction illustrated in FIG. 8A. Therefore, in a state where adapters 50 are stored and held in storage block 60, both ends of flange 51 abuts against the upper surface of storage block 60 and block member 53 is in a state of being accommodated in storage opening 60b (FIGS. 15A and 15B).

Upwardly convex protrusions 61 are provided in pairs on the upper surface of storage block 60 and then storage opening 60b is interposed therebetween in the Y direction. A gap of the pair of protrusions 61 is set to a gap corresponding to cutouts 51a of flange 51. A thickness dimension of protrusion 61 is set to be smaller than a predetermined gap between locking plate 62 described below and the upper surface of storage block 60 and, in exemplary embodiment, is set to be substantially the same as thickness dimension L3 of flange 51 illustrated in FIG. 8A. Cutout 51a of flange 51 is engaged with protrusion 61 and thereby adapter 50, which is stored and held in storage block 60, is in a state where a position thereof in a horizontal plane is fixed (FIG. 15A). That is, protrusion 61 and cutout 51a of flange 51 are a storage position fixing portion for fixing the storage position of adapter 50.

Locking plate 62 having a shape to cover a substantially entire range of storage block 60 is provided a slidably in the horizontal direction above storage block 60 to have a predetermined gap from the upper surface of storage block 60. One end portion of locking plate 62 is connected to rod 63a included in slide mechanism 63 provided on a lower surface of storage block 60. Slide mechanism 63 causes rod 63a to be protruded and retracted by the driving of a drive motor (not illustrated). Therefore, locking plate 62 reciprocates (arrow h) above storage block 60. A predetermined gap between locking plate 62 and the upper surface of storage block 60 is set to be greater than thickness dimension L3 (FIG. 8A) of flange 51 and a thickness dimension of protrusion 61. Therefore, in a state where adapter 50 is stored and held in storage block 60, sliding of locking plate 62 is not interfered.

A plurality of openings 64 are provided in positions corresponding to the arrangement of the plurality of storage openings 60b in locking plate 62. Opening 64 is configured of a plurality (two in the example) of adapter insertion openings 64a and relief openings 64b, of which a center is the X direction, passing through the plurality of adapter insertion openings 64a and the openings are continuously formed. Opening width dimension R2 of adapter insertion opening 64a in the Y direction is set to be greater than diameter dimension L2 (FIG. 8A) of flange 51 of adapter 50 in the longitudinal direction and width dimension R3 of the opening in the X direction is set to be greater than diameter dimension L4 of flange 51 in the width direction as illustrated in FIG. 8A. Therefore, adapter insertion opening 64a has a size such that adapter 50 is able to be inserted into adapter insertion opening 64a. Two adapter insertion openings 64a are disposed at a gap corresponding to adapters 50 in a state of being respectively mounted on the pair of chuck claws 39. Adapters 50 mounted on the pair of chuck claws 39 can be simultaneously inserted into adapter insertion openings 64a.

Figure 15C:
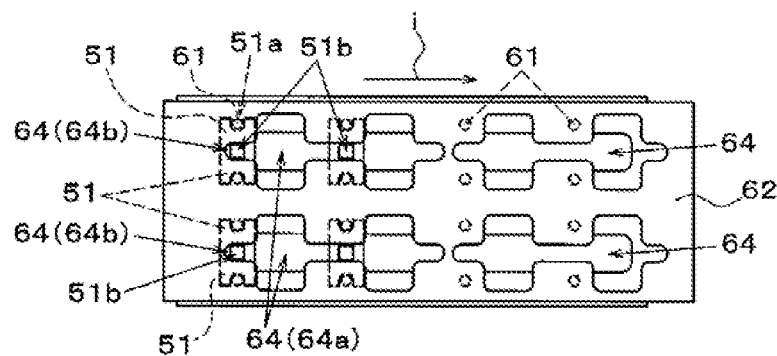
FIG. 15C is a plan view of the adapter stocker included in the component mounting apparatus in an exemplary embodiment of the disclosure.

Relief opening 64b has a size to communicate with opening 51b of flange 51 in the vertical direction. Therefore, even if locking plate 62 is slid in arbitrary direction, opening 51b of flange 51 of adapter 50 stored and held in storage block 60 is always in a state of communicating with one of adapter insertion opening 64a and relief opening 64b (FIGS. 15A and 15C). Therefore, even in a state where locking plate 62 is moved in arbitrary direction, claw 42 of chuck claw 39 and the body of locking plate 62 do not interfere and it is possible to insert and remove claw 42 with respect to opening 51b of flange 51.

Next, a function of locking plate 62 will be described with reference to FIGS. 15A to 15D. FIGS. 15A and 15B illustrate a state where two sets of the pair of adapters 50 are stored in adapter stocker 20. Adapter 50 is stored and held in storage block 60 in a state where protrusion 61 is engaged with cutout 51a of flange 51 and block member 53 is accommodated in storage opening 60b. In this case, locking plate 62 is in a position in which relief opening 64b does not overlap flange 51 in the vertical direction, adapter insertion opening 64a overlaps adapter 50 in the vertical direction, and thereby locking plate 62 is in a state that does not interfere the insertion of adapter 50. That is, in this state, adapter 50 which is stored and held already can be taken out from adapter stocker 20 and it is possible to store and hold new adapter 50 in empty storage opening 60b in which adapter 50 is not stored.

Figure 15D:
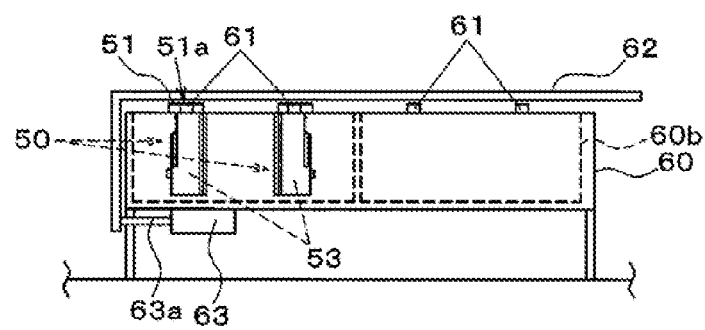
FIG. 15D is a side view of the adapter stocker included in the component mounting apparatus in an exemplary embodiment of the disclosure.

FIGS. 15C and 15D illustrate a state where locking plate 62 is slid in an arrow i direction by driving slide mechanism 63. That is, locking plate 62 is moved by the driving of slide mechanism 63 and thereby the body of locking plate 62 is in a state of overlapping a region including both ends of flange 51, which abuts against the upper surface of storage block 60, in the vertical direction. In this state, the upward movement of adapter 50 is regulated by locking plate 62. In other words, adapter 50 is in a state of being locked by locking plate 62 included in adapter stocker 20. Moreover, even if locking plate 62 is slid, opening 51b of flange 51 is in a state of communicating with relief opening 64b in the vertical direction. Therefore, even in a state where adapter 50 is locked by locking plate 62, adapter 50 can be mounted and demounted with respect to chuck claw 39.

Figure 16:
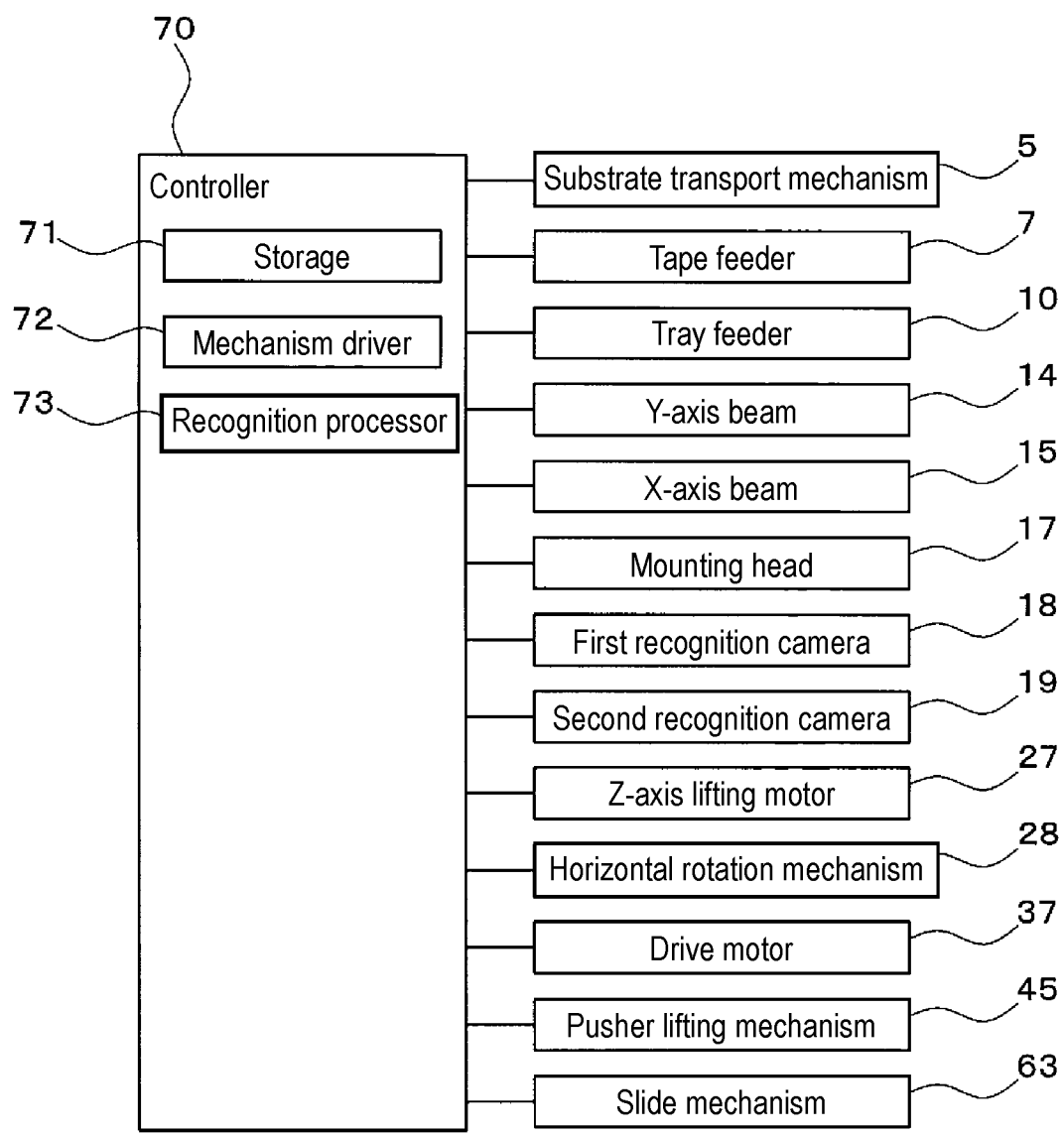
FIG. 16 is a block diagram illustrating a configuration of a control system of the component mounting apparatus in an exemplary embodiment of the disclosure.

Next, a configuration of the control system of component mounting apparatus 1 will be described with reference to FIG. 16. Controller 70 included in component mounting apparatus 1 is configured to include storage 71, mechanism driver 72, and recognition processor 73. In addition, controller 70 is connected to substrate transport mechanism 5, tape feeder 7, tray feeder 10, Y-axis beam 14, X-axis beam 15, mounting head 17, first recognition camera 18, second recognition camera 19, Z-axis lifting motor 27, horizontal rotation mechanism 28, drive motor 37, pusher lifting mechanism 45, and slide mechanism 63.

Storage 71 stores various kinds of production data required to mount component 3 on substrate 2. Mechanism driver 72 is controlled by controller 70 and drives substrate transport mechanism 5, tape feeder 7, tray feeder 10, Y-axis beam 14, X-axis beam 15, mounting head 17, first recognition camera 18, second recognition camera 19, Z-axis lifting motor 27, horizontal rotation mechanism 28, drive motor 37, and pusher lifting mechanism 45. Therefore, the component mounting work is performed. In addition, mechanism driver 72 drives Y-axis beam 14, X-axis beam 15, mounting head 17, Z-axis lifting motor 27, horizontal rotation mechanism 28, drive motor 37, and slide mechanism 63. Therefore, work for mounting and demounting of adapter 50 with respect to chuck claw 39 is performed.

Recognition processor 73 performs recognition processing of an image acquired by first recognition camera 18 and second recognition camera 19 thereby detecting the substrate mark (not illustrated) formed in substrate 2, component 3 supplied on the component supply position by tape feeder 7, and component 3 held in mounting head 17. A detection result of the substrate mark and component 3 is used when mounting head 17 is aligned with respect to substrate 2 during mounting of component 3.

Figure 17A:
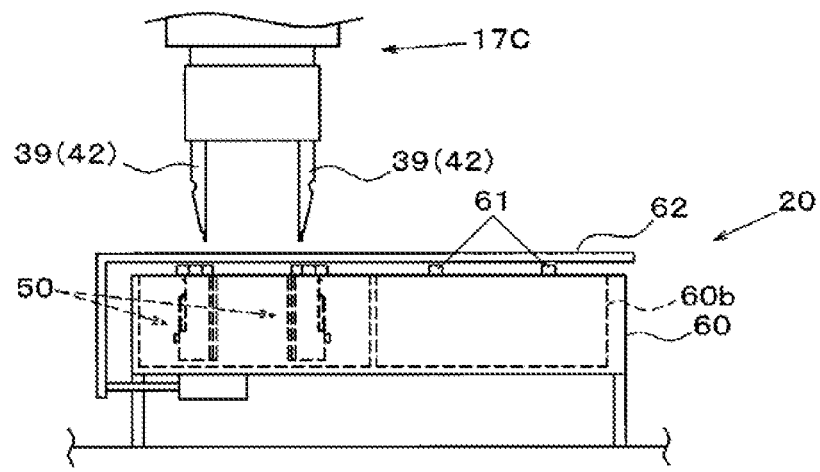
FIG. 17A is an explanatory view of an operation for mounting the adapter on the chuck claw in an exemplary embodiment of the disclosure.
Figure 17B:
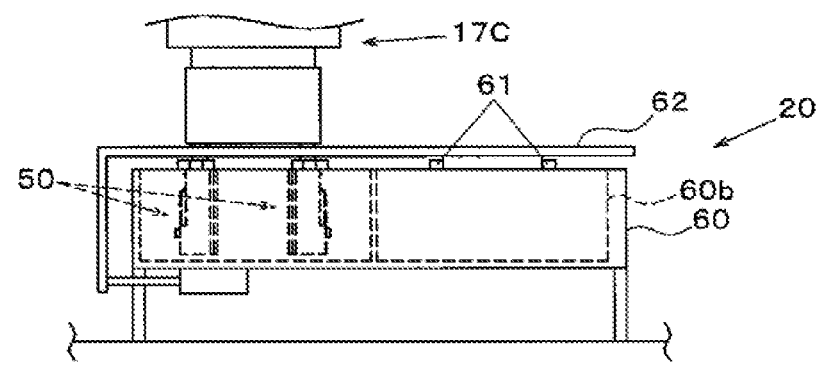
FIG. 17B is an explanatory view of the operation for mounting the adapter on the chuck claw in an exemplary embodiment of the disclosure.

Component mounting apparatus 1 in the exemplary embodiment is configured as described above. The mounting operation of adapter 50 with respect to chuck claw 39 will be described with reference to FIGS. 17A to 17C. First, as illustrated in FIG. 17A, unit head 17C is moved above adapter stocker 20 and is aligned above the pair of adapters 50 in which the pair of chuck claws 39 are objects to be mounted (ST1: aligning process). Next, as illustrated in FIG. 17B, unit head 17C is lowered and then the leading end of claw 42 of chuck claw 39 is inserted into opening 51b of flange 51 (ST2: inserting process). Moreover, before performing (ST2), locking plate 62 is moved in advance so that adapter 50 and adapter insertion opening 64a match each other in the vertical direction (FIGS. 15A and 15B).

Figure 17C:
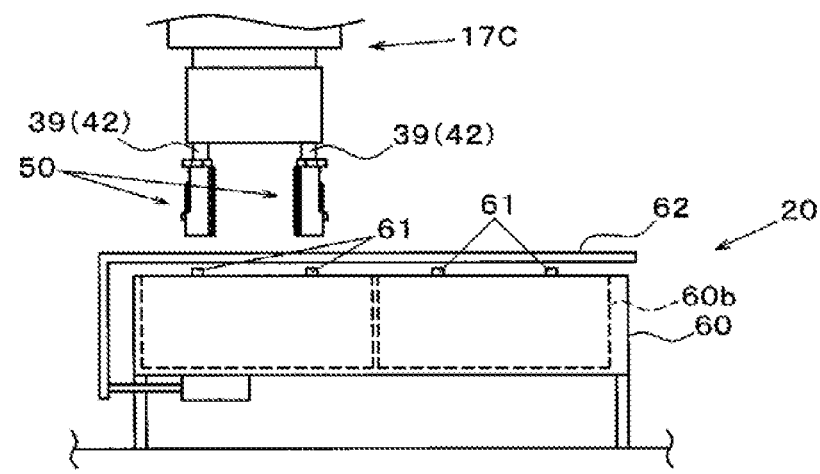
FIG. 17C is an explanatory view of the operation for mounting the adapter on the chuck claw in an exemplary embodiment of the disclosure.

Thereafter, at a predetermined timing in a process in which claw 42 of chuck claw 39 passes through first opening 53a of block member 53, bending portion 54b of leaf spring member 54 is fitted into locking groove 42a of claw 42 and is locked (FIG. 11B). Therefore, adapter 50 is mounted on chuck claw 39. Next, as illustrated in FIG. 17C, unit head 17C is lifted and thereby adapter 50 mounted on chuck claw 39 is taken out from adapter stocker 20.

As described above, in the exemplary embodiment, chuck claws 39 (first gripping members) are lowered from above adapters 50 (second gripping members) of a state of being stored in adapter stocker 20 (gripping member storage) and chuck claws 39 are inserted into openings (opening 51b and first opening 53a). Therefore, adapters 50 are mounted on chuck claws 39. Then, it is possible to replace the gripping members (chuck claw 39 and adapter 50) in accordance with the size of component 3 in a short period of time and easily. In addition, it is possible to collectively mount the pair of adapters 50 on chuck claws 39 without manual work of the operator.

Figure 18A:
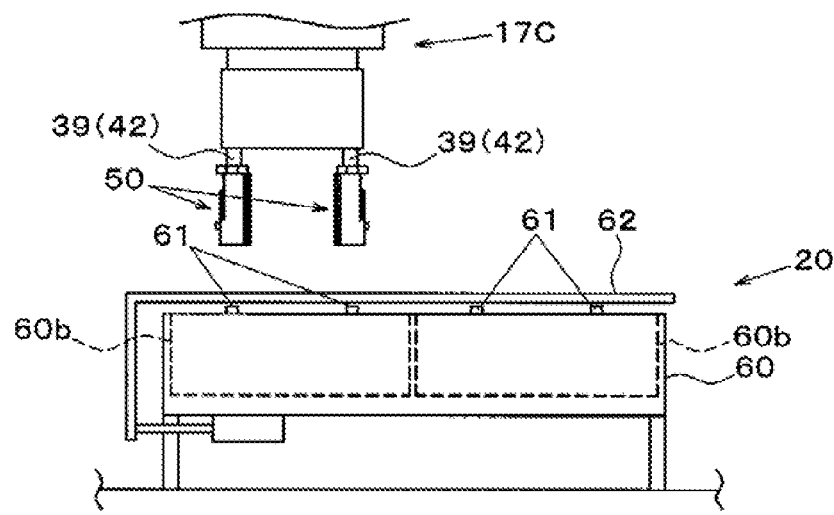
FIG. 18A is an explanatory view of an operation for removing the adapter mounted on the chuck claw in an exemplary embodiment of the disclosure.
Figure 18B:
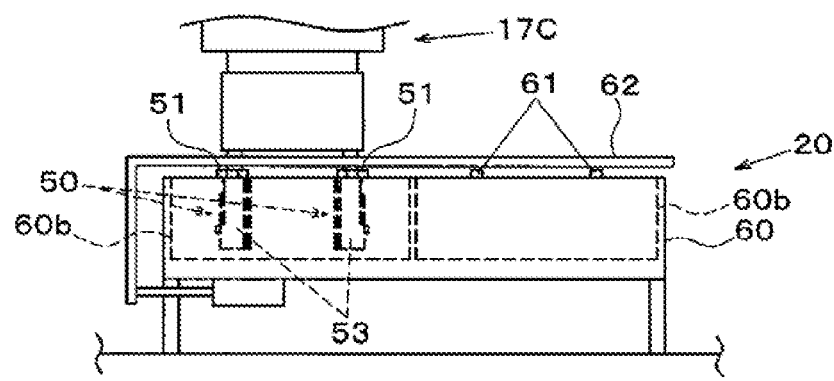
FIG. 18B is an explanatory view of the operation for removing the adapter mounted on the chuck claw in an exemplary embodiment of the disclosure.

Next, the removing operation of adapter 50 mounted on chuck claw 39 will be described with reference to FIGS. 18A to 19. First, as illustrated in FIG. 18A, unit head 17C is moved above adapter stocker 20 and the pair of adapters 50 are aligned above storage openings 60b that are storage destinations (ST11: aligning process). Next, as illustrated in FIG. 18B, unit head 17C is lowered, and then both ends of flange 51 abut against the upper surface of storage block 60 while block member 53 is accommodated in storage opening 60b. Therefore, adapter 50 is stored and held in storage block 60 (ST22: storing process). In this case, cutout 51a of flange 51 is engaged with protrusion 61 and then the position of adapter 50 is fixed in the horizontal plane. Moreover, before performing (ST22), locking plate 62 is moved in advance so that adapters 50 mounted on the pair of chuck claws 39 and adapter insertion openings 64a match in the vertical direction (FIGS. 15A and 15B).

Figure 18C:
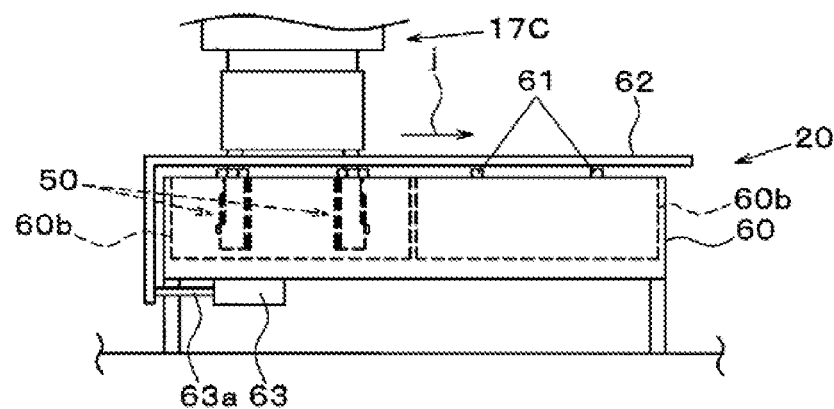
FIG. 18C is an explanatory view of the operation for removing the adapter mounted on the chuck claw in an exemplary embodiment of the disclosure.
Figure 19:
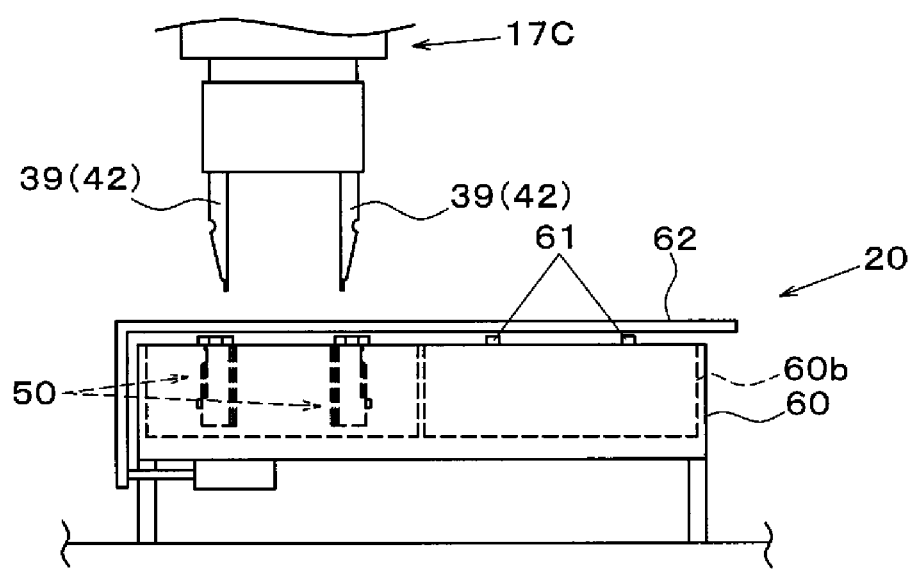
FIG. 19 is an explanatory view of the operation for removing the adapter mounted on the chuck claw in an exemplary embodiment of the disclosure.

Next, as illustrated in FIG. 18C, locking plate 62 is slid (arrow j) thereby locking adapter 50 that is stored and held (ST23: locking process) (also see FIGS. 15C and 15D). Therefore, the upward movement of adapters 50 is in a state of being regulated. Next, as illustrated in FIG. 19, unit head 17C is lifted and thereby adapter 50 is removed from chuck claw 39 (ST24: removing process). That is, in the process of lifting of unit head 17C, flange 51 comes into contact with the lower surface of the body of locking plate 62 thereby preventing the upward movement thereof. Then, unit head 17C is further lifted and then the locking state between bending portion 54b and locking groove 42a is forcedly released and adapter 50 is separated from chuck claw 39. Therefore, adapter 50 is automatically removed from chuck claw 39.

Next, a component mounting method for mounting component 3 supplied by tray feeder 10 on the substrate will be described. First, controller 70 determines whether or not component 3 that is the object to be mounted is capable of being gripped by chuck claws 39 (ST31: determining process). If it is determined that component 3 is not capable of being gripped in (ST31), controller 70 performs a process for mounting adapters 50 suitable for gripping component 3 on chuck claws 39 (ST32: gripping member mounting process). That is, unit head 17C accesses to adapter stocker 20. Then, chuck claws 39 are lowered from above adapters 50 which are stored and held in adapter stocker 20 and then chuck claws 39 are inserted into the openings. Therefore, adapters 50 are mounted on chuck claws 39.

In a case where component 3 that is the object to be mounted is determined to be capable of being gripped by chuck claws 39 in (ST31), or after adapters 50 are mounted on chuck claws 39 in (ST32), mounting head 17 is moved to the supply position of component 3 by tray feeder 10 and component 3 is gripped in the position by chuck claws 39 or adapters 50 (ST33: component gripping process). Next, mounting head 17 is moved above substrate 2 which is aligned in advance in a predetermined work position. Next, unit head 17C is lowered and then component 3 gripped by chuck claws 39 or adapters 50 is mounted on substrate 2 (ST34: mounting process). That is, in the process (ST34), component 3 is gripped and is mounted on substrate 2 by using chuck claws 39 or adapters 50 mounted on chuck claws 39. As described above, according to the exemplary embodiment, adapters 50 suitable for gripping of component 3 is automatically mounted on chuck claws 39, component 3 is gripped and mounted on substrate 2 by using adapters 50. Therefore, it is possible to realize flexible production in accordance with the various types of components 3.

The component mounting apparatus of the disclosure is not limited to the exemplary embodiments described above and can be performed without departing from the scope of the disclosure. For example, chuck claw 39 is configured of only claw 42 without base 41 and a predetermined position of claw 42 may be fixed by chuck holder 38.

In addition, in the exemplary embodiments of the disclosure, component 3 that is the object to be worked by chuck unit 25 is described as a large-sized component including the pair of leads 3b on the lower surface of body 3a and being supplied by tray feeder 10. However, a component supplied by a member other than tray feeder 10 may be an object to be worked by chuck unit 25. Specifically, a radial component or an axial component is transported and may be supplied on a radial feeder, an axial feeder, and the like which supply the component on chuck unit 25.

According to the exemplary embodiments of the disclosure, the work load of the operator is reduced, it is possible to easily change the gripping mode of the component in accordance with the component, and the disclosure is particularly useful in the component mounting field.

What is claimed is:

1. A component mounting apparatus for mounting a first component and a second component on a substrate, the apparatus comprising:
    a pair of first gripping members configured to sandwich and grip the first component;
    a pair of second gripping members configured to be detachably mounted on the pair of first gripping members and grip the second component in place of the pair of first gripping members; and
    a protrusion protruding from an upper surface of each of the pair of second gripping members and extending in a direction vertically away from the upper surface of each of the pair of second gripping members,
    wherein each of the pair of first gripping members has a first gripping surface for gripping the first component,
    wherein each of the pair of second gripping members has a second gripping surface for gripping the second component,
    wherein each of the pair of first gripping members has a locking groove at a side opposite to the first gripping surface,
    wherein each of the pair of second gripping members has a locking portion configured to be locked into the locking groove, and
    wherein each of the protrusions is configured to abut against a bottom surface of a base of each of the pair of first gripping members when the pair of second gripping members is mounted on the pair of first gripping members.

2. The component mounting apparatus of claim 1, wherein shapes or sizes of the first gripping surfaces are different from shapes or sizes of the second gripping surfaces.

3. The component mounting apparatus of claim 1, further comprising:
    a gripping member mover configured to move at least one of the first gripping members of the pair of first gripping members in a direction in which at least the one of the first gripping members approaches or separates from the other of the first gripping members.

4. The component mounting apparatus of claim 1, wherein the second gripping surfaces are coated with an elastic member.

5. The component mounting apparatus of claim 1, further comprising:
    a controller configured to mount the pair of second gripping members on the pair of the first gripping members when the second component is mounted on the substrate.

6. The component mounting apparatus of claim 5, further comprising:
    a gripping member storage configured to store the pair of second gripping members,
    wherein each of the pair of second gripping members has an opening at an upper surface of each of the pair of second gripping members, and
    wherein the controller is configured to insert each of the pair of first gripping members into the opening of each of the pair of second gripping members stored in the gripping member storage.

7. The component mounting apparatus of claim 6, wherein each of the pair of second gripping members has a flange and a block member
    wherein the gripping member storage has at least one storage opening, and
    wherein a size of the at least one storage opening is greater than a size of the block member and less than a size of the flange in a plan view.

* * * * *